United States Patent
DeLaCruz et al.

(10) Patent No.: US 11,848,284 B2
(45) Date of Patent: Dec. 19, 2023

(54) PROTECTIVE ELEMENTS FOR BONDED STRUCTURES

(71) Applicant: ADEIA SEMICONDUCTOR BONDING TECHNOLOGIES INC., San Jose, CA (US)

(72) Inventors: Javier A DeLaCruz, San Jose, CA (US); Belgacem Haba, Saratoga, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 17/834,737

(22) Filed: Jun. 7, 2022

(65) Prior Publication Data
US 2022/0302048 A1  Sep. 22, 2022

Related U.S. Application Data

(63) Continuation of application No. 16/844,941, filed on Apr. 9, 2020, now Pat. No. 11,373,963.
(Continued)

(51) Int. Cl.
*H01L 23/00* (2006.01)
*H01L 21/66* (2006.01)
*H01L 23/528* (2006.01)

(52) U.S. Cl.
CPC ............ *H01L 23/573* (2013.01); *H01L 22/34* (2013.01); *H01L 23/528* (2013.01);
(Continued)

(58) Field of Classification Search
None
See application file for complete search history.

(56) References Cited

U.S. PATENT DOCUMENTS

| 5,451,547 A | 9/1995 | Himi et al. |
| 5,753,536 A | 5/1998 | Sugiyama et al. |

(Continued)

FOREIGN PATENT DOCUMENTS

| CN | 107946249 A | 4/2018 |
| JP | 2002-353416 A | 12/2002 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Telly D Green
(74) *Attorney, Agent, or Firm* — Knobbe Martens Olson & Bear, LLP

(57) ABSTRACT

A bonded structure is disclosed. The bonded structure can include a semiconductor element comprising active circuitry. The bonded structure can include a protective element directly bonded to the semiconductor element without an adhesive along a bonding interface. The protective element can include an obstructive material disposed over at least a portion of the active circuitry. The obstructive material can be configured to obstruct external access to the active circuitry. The bonded structure can include a disruption structure configured to disrupt functionality of the at least a portion of the active circuitry upon debonding of the protective element from the semiconductor element.

16 Claims, 8 Drawing Sheets

Related U.S. Application Data

(60) Provisional application No. 62/953,071, filed on Dec. 23, 2019, provisional application No. 62/953,058, filed on Dec. 23, 2019, provisional application No. 62/851,512, filed on May 22, 2019, provisional application No. 62/833,491, filed on Apr. 12, 2019.

(52) U.S. Cl.
CPC ............ *H01L 23/562* (2013.01); *H01L 24/05* (2013.01); *H01L 24/08* (2013.01); *H01L 24/27* (2013.01); *H01L 24/29* (2013.01); *H01L 24/32* (2013.01); *H01L 24/48* (2013.01); *H01L 24/73* (2013.01); *H01L 24/83* (2013.01); *H01L 24/49* (2013.01); *H01L 2224/08237* (2013.01); *H01L 2224/29082* (2013.01); *H01L 2224/29187* (2013.01); *H01L 2224/32225* (2013.01); *H01L 2224/48091* (2013.01); *H01L 2224/48106* (2013.01); *H01L 2224/48225* (2013.01); *H01L 2224/49171* (2013.01); *H01L 2224/73215* (2013.01)

(56) References Cited

U.S. PATENT DOCUMENTS

| | | |
|---|---|---|
| 5,771,555 A | 6/1998 | Eda et al. |
| 6,080,640 A | 6/2000 | Gardner et al. |
| 6,180,496 B1 | 1/2001 | Farrens et al. |
| 6,423,640 B1 | 7/2002 | Lee et al. |
| 6,465,892 B1 | 10/2002 | Suga |
| 6,645,828 B1 | 11/2003 | Farrens et al. |
| 6,887,769 B2 | 5/2005 | Kellar et al. |
| 6,908,027 B2 | 6/2005 | Tolchinsky et al. |
| 6,908,832 B2 | 6/2005 | Farrens et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,489,013 B1 | 2/2009 | Chubin et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,581,108 B1 | 11/2013 | Boone et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,196,555 B1 | 11/2015 | Lower et al. |
| 9,224,704 B2 | 12/2015 | Landru |
| 9,230,941 B2 | 1/2016 | Chen et al. |
| 9,246,311 B1 | 1/2016 | Raring et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,455,233 B1 | 9/2016 | Bhooshan et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,014,429 B2 | 7/2018 | Newman et al. |
| 10,026,605 B2 | 7/2018 | Doub et al. |
| 10,026,716 B2 | 7/2018 | Yu et al. |
| 10,075,657 B2 | 9/2018 | Fahim et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,886,255 B2 | 1/2021 | Hong et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,625 B2 * | 12/2021 | DeLaCruz ............ H01L 23/573 |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,373,963 B2 * | 6/2022 | DeLaCruz ............ H01L 24/32 |
| 11,385,278 B2 | 7/2022 | DeLaCruz et al. |
| 11,387,196 B2 | 7/2022 | Kang et al. |
| 11,610,846 B2 | 3/2023 | Haba et al. |
| 2002/0003307 A1 | 1/2002 | Suga |
| 2004/0084414 A1 | 5/2004 | Sakai et al. |
| 2004/0188819 A1 | 9/2004 | Farnworth et al. |
| 2006/0057945 A1 | 3/2006 | Hsu et al. |
| 2007/0030022 A1 | 2/2007 | Kash et al. |
| 2007/0111386 A1 | 5/2007 | Kim et al. |
| 2008/0006938 A1 | 1/2008 | Patti et al. |
| 2008/0088996 A1 | 4/2008 | Bonvalot et al. |
| 2008/0251906 A1 | 10/2008 | Eaton et al. |

(56) References Cited

U.S. PATENT DOCUMENTS

| | | |
|---|---|---|
| 2009/0072343 A1 | 3/2009 | Ohnuma et al. |
| 2009/0246355 A9 | 10/2009 | Lower et al. |
| 2010/0032776 A1 | 2/2010 | Pham et al. |
| 2010/0171202 A1 | 7/2010 | Tian et al. |
| 2010/0190334 A1 | 7/2010 | Lee |
| 2010/0216294 A1 | 8/2010 | Rabarot et al. |
| 2010/0314149 A1 | 12/2010 | Gerrish et al. |
| 2010/0315108 A1 | 12/2010 | Fornara et al. |
| 2011/0090658 A1 | 4/2011 | Adams et al. |
| 2012/0256305 A1 | 10/2012 | Kaufmann et al. |
| 2013/0328174 A1 | 12/2013 | La Tulipe, Jr. et al. |
| 2014/0035136 A1 | 2/2014 | Buer et al. |
| 2014/0175655 A1 | 6/2014 | Chen et al. |
| 2015/0064498 A1 | 3/2015 | Tong |
| 2015/0262976 A1 | 9/2015 | Edelstein et al. |
| 2016/0315055 A1 | 10/2016 | Vogt et al. |
| 2016/0343682 A1 | 11/2016 | Kawasaki |
| 2017/0373024 A1 | 12/2017 | Graf et al. |
| 2018/0061781 A1 | 3/2018 | Petitdidier et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0308808 A1 | 10/2018 | Kirschner et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0135698 A1 | 4/2020 | Hong et al. |
| 2020/0194396 A1 | 6/2020 | Uzoh |
| 2020/0227367 A1 | 7/2020 | Haba et al. |
| 2020/0235059 A1 | 7/2020 | Cok et al. |
| 2020/0243380 A1 | 7/2020 | Uzoh et al. |
| 2020/0249324 A1 | 8/2020 | Steinberg et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0335450 A1 | 10/2020 | Wang et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0210439 A1 | 7/2021 | Lim et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0134511 A1 | 5/2022 | Ankersen |
| 2022/0139849 A1 | 5/2022 | DeLaCruz et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0373593 A1 | 11/2022 | DeLaCruz et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |

FOREIGN PATENT DOCUMENTS

| | | |
|---|---|---|
| JP | 2010-272622 A | 12/2010 |
| JP | 2013-033786 A | 2/2013 |
| JP | 2018-160519 A | 10/2018 |
| WO | WO 2005/043584 A2 | 5/2005 |
| WO | WO 2006/013507 A1 | 2/2006 |
| WO | WO 2020/034063 A1 | 2/2020 |

OTHER PUBLICATIONS

Bengtsson et al., "Low temperature bonding," International Conference on Compliant & Alternative Substrate Technology, Sep. 1999, p. 10.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele et al., "Semiconductor Wafer Bonding: A flexible approach to materials combinations in microelectronics; micromechanics and optoelectronics," IEEE, 1997, pp. 23-32.

International Search Report and Written Opinion dated Jul. 29, 2020, in International Application No. PCT/US2020/027772, 8 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Knechtel, J. et al., "3D integration: Another dimension toward hardware security," 2019 IEEE 25th International Symposium on On-Line Testing and Robust System Design, Jul. 2019, 5 pages.

(56) References Cited

OTHER PUBLICATIONS

Lohrke, H. et al., "No place to hide: Contactless probing of secret data on FPGAs," International Association for Cryptologic Research 2016, Gierlichs B., Poschmann A. (eds) Cryptographic Hardware and Embedded Systems—CHES 2016, pp. 147-167.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Non-Final Office Action dated Apr. 1, 2021, U.S. Appl. No. 16/846,177, 16 pages.

Non-Final Office Action dated Apr. 15, 2021, U.S. Appl. No. 16/844,932, 33 pages.

Non-Final Office Action dated Aug. 26, 2021, U.S. Appl. No. 16/881,621, 20 pages.

Notice of Allowance dated Aug. 17, 2021, U.S. Appl. No. 16/846,177, 10 pages.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Wang et al., Probing attacks on integrated circuits: Challenges and research opportunities, IEEE Design & Test, Sep./Oct. 2017, vol. 34, No. 5, pp. 63-71.

* cited by examiner

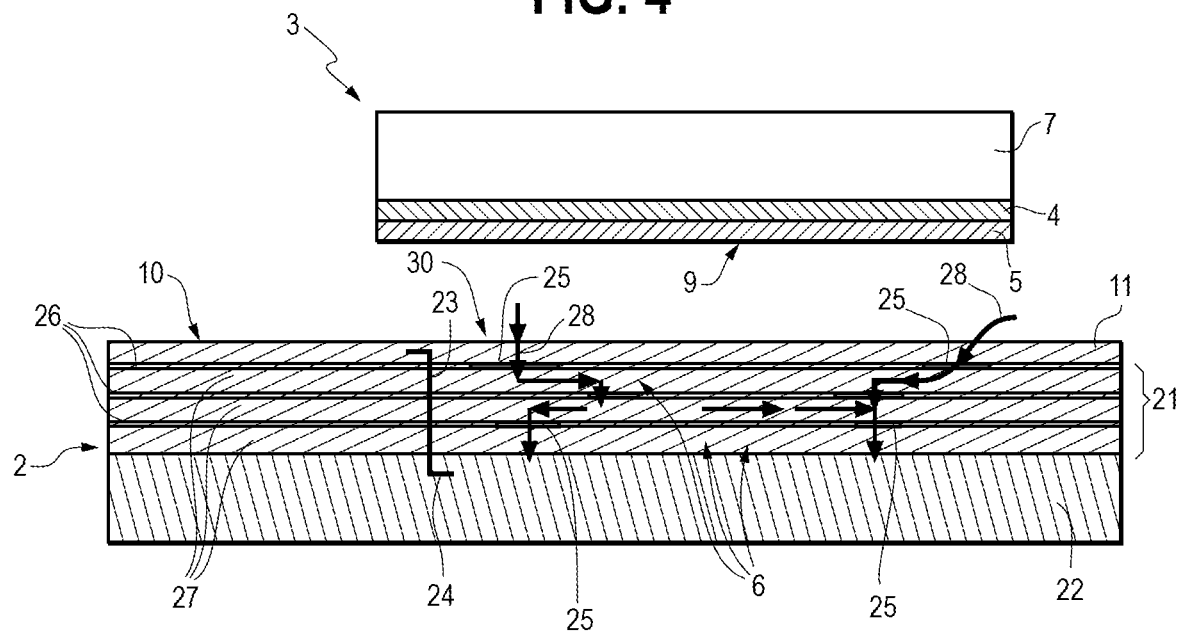

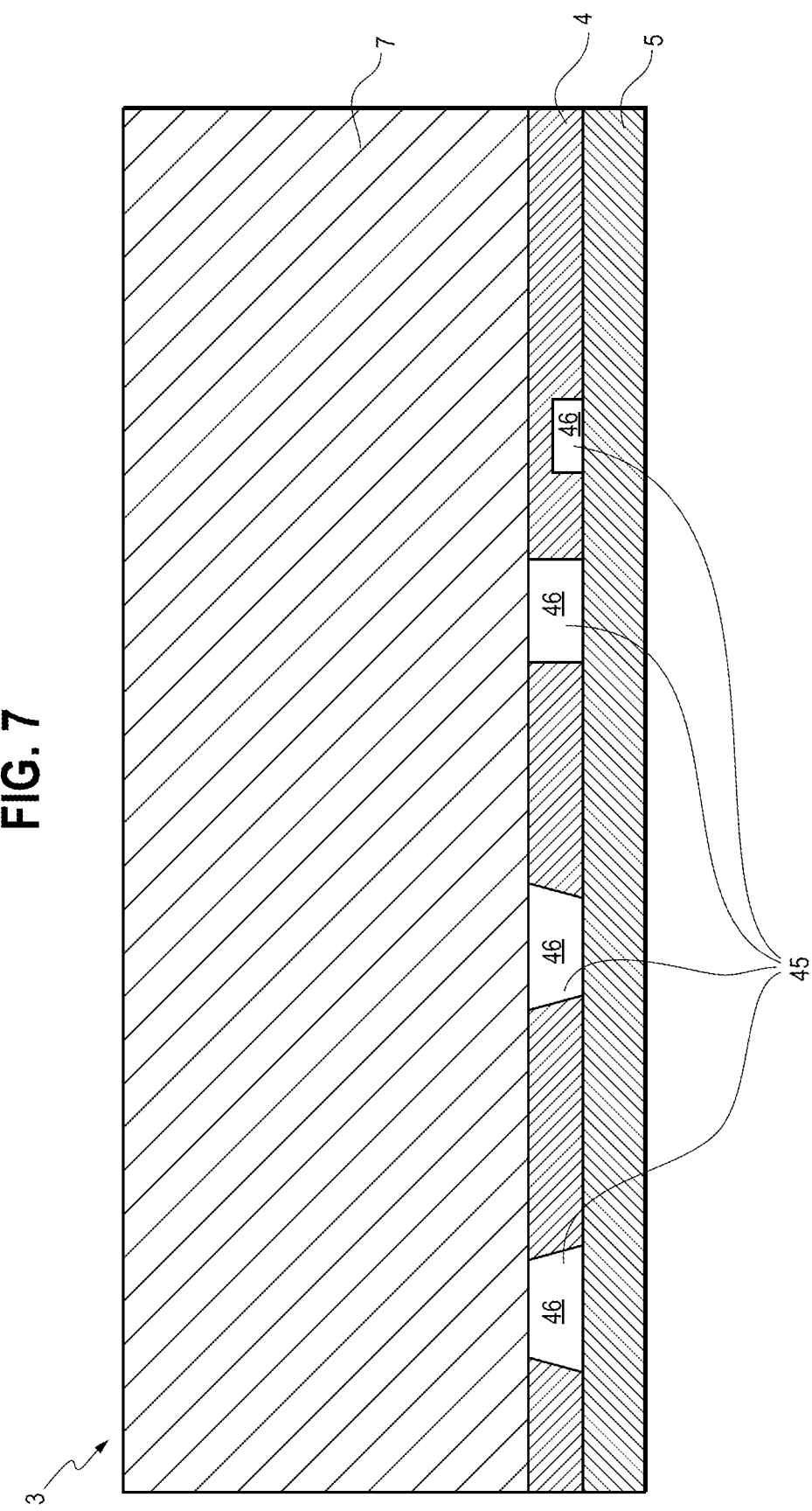

PROTECTIVE ELEMENTS FOR BONDED STRUCTURES

CROSS-REFERENCE TO RELATED APPLICATIONS

This application is a continuation of U.S. patent application Ser. No. 16/844,941, filed Apr. 9, 2020, which claims priority to U.S. Provisional Patent Application No. 62/851,512, filed May 22, 2019; and claims priority to U.S. Provisional Patent Application No. 62/953,071, filed Dec. 23, 2019; and claims priority to U.S. Provisional Patent Application No. 62/833,491, filed Apr. 12, 2019; and claims priority to U.S. Provisional Patent Application No. 62/953,058, filed Dec. 23, 2019, the contents of each of which are hereby incorporated by reference herein in their entirety and for all purposes.

BACKGROUND

Field of the Invention

The field relates to protective or obstructive elements for bonded structures and, in particular, to disruption structures configured to disrupt functionality of active circuitry upon delayering or otherwise reverse engineering of the protective elements.

Description of the Related Art

Semiconductor chips (e.g., integrated device dies) may include active circuitry containing security-sensitive components which contain valuable and/or proprietary information, structures or devices. For example, such security-sensitive components may include an entity's intellectual property, software or hardware security (e.g., encryption) features, privacy data, or any other components or data that the entity may wish to remain secure and hidden from third parties. For example, third party bad actors may utilize various techniques to attempt to access security-sensitive components for economic and/or geopolitical advantage. Accordingly, there remains a continuing need for improving the security of semiconductor chips from being accessed by third parties.

BRIEF DESCRIPTION OF THE DRAWINGS

FIG. 4 is a schematic side view of a protective element and a semiconductor element before bonding, according to another embodiment.

FIG. 7 is a schematic side sectional view of a protective element according to various embodiments.

DETAILED DESCRIPTION

As explained herein, third parties (such as third party bad actors) may attempt to access security-sensitive components on elements such as integrated device dies. In some elements, the security-sensitive components may be protected by a combination of netlist and non-volatile memory (NVM) data. However, third parties may attempt to hack the security-sensitive components by a combination of destructive and non-destructive techniques, e.g. probing and/or delayering the element to expose or otherwise gain access to the security-sensitive components. In some cases, the third party may attempt to hack the security-sensitive components by pulsing electromagnetic (EM) waves onto active circuitry of the element, using fault injection techniques, employing near infrared (NIR) triggering or focused ion beam (FIB) modification of circuits, chemical etching techniques, and other physical, chemical, and/or electromagnetic hacking tools and even reverse engineering. These techniques can be used to physically access sensitive circuits of microdevices such as integrated circuits to directly read encrypted information, to trigger circuits externally to release information otherwise encrypted, to understand manufacturing processes, or even to extract enough information to be able to eventually replicate sensitive designs. For example, in some cases hackers may attempt to access the encryption key, which can be stored in the circuit design, in memory, or in a combination of both. Techniques can also be used to indirectly read sensitive information by analyzing the resultant output based upon fault injection inputs, and through recursive analysis determine the encryption key or data contents. It is challenging to structurally protect the security-sensitive components on elements.

Accordingly, it is important to provide improved security for elements (such as semiconductor integrated device dies) that include security-sensitive components.

Figure 1:
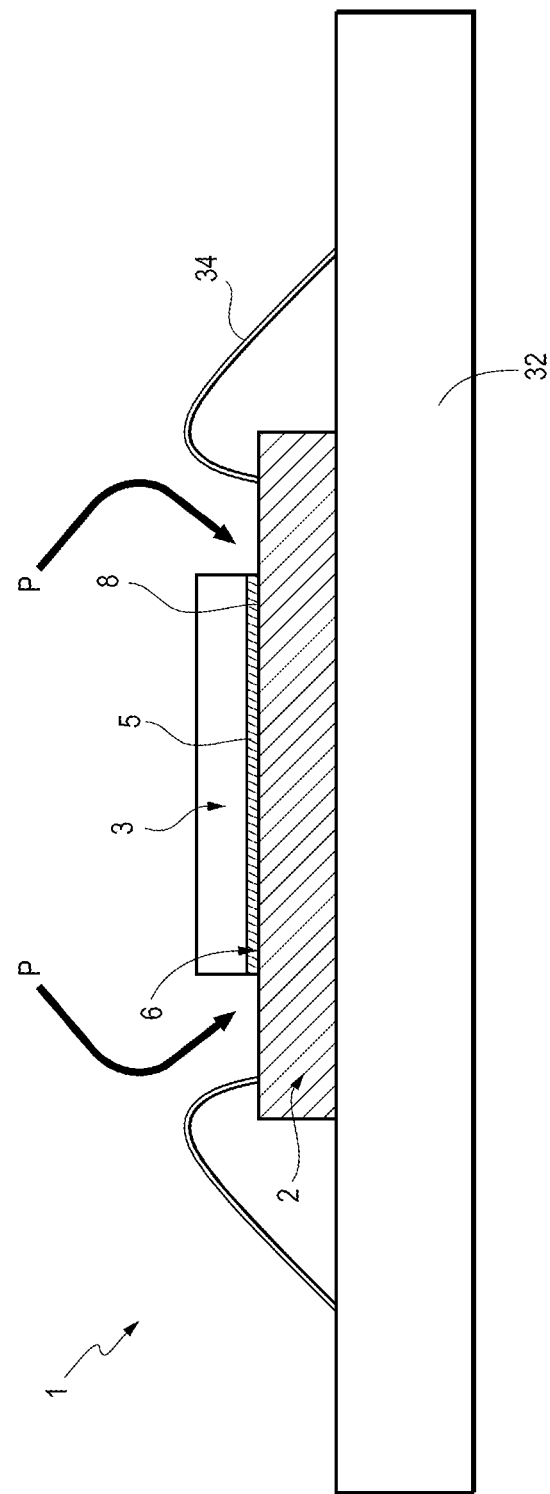
FIG. 1 is a schematic side sectional view of a bonded structure that includes a protective element bonded (e.g., directly bonded) to a semiconductor element, and possible chemical attack pathways for debonding or damaging sensitive circuitry.
Figure 2A:
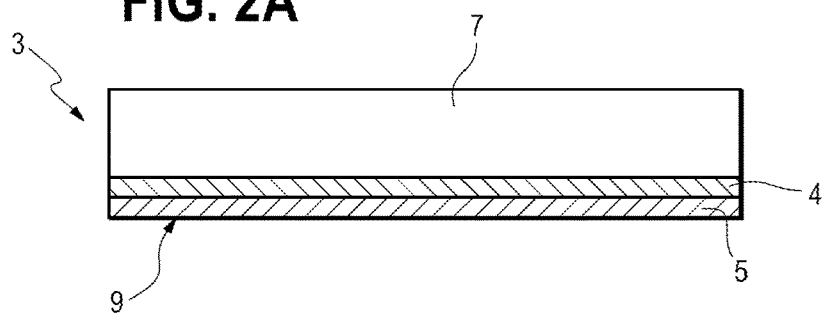
FIG. 2A is a schematic side sectional view of the protective element.
Figure 2B:
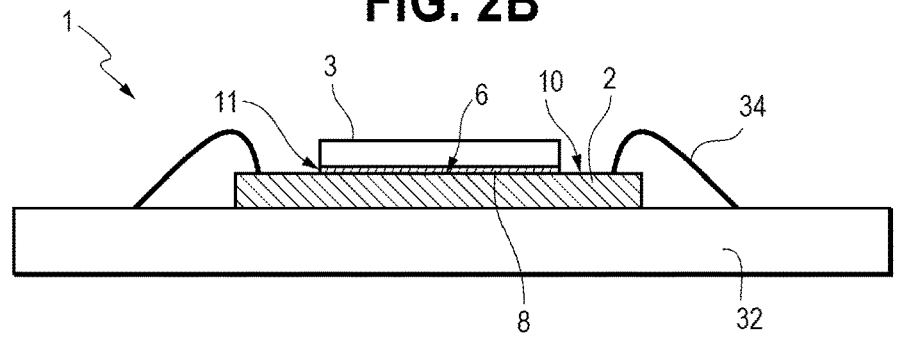
FIG. 2B is a schematic side sectional view of the bonded structure of FIG. 1 without illustrating the chemical attach pathway.
Figure 2C:
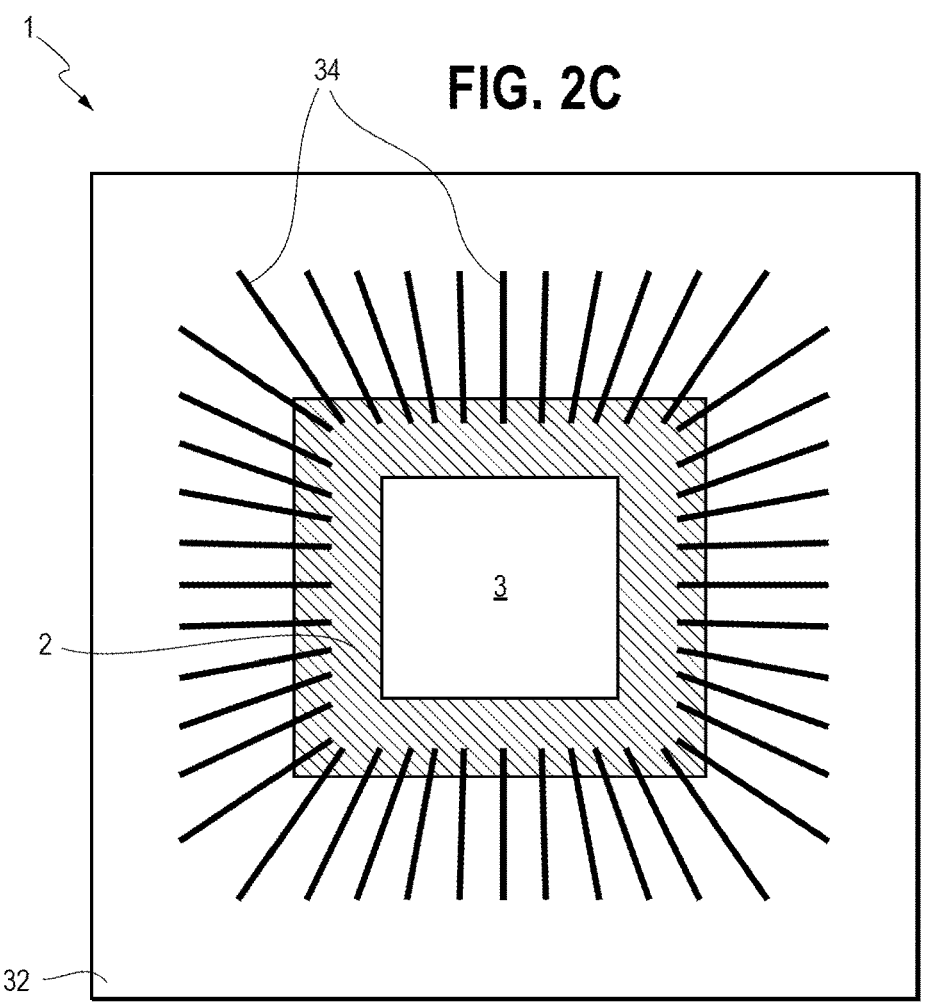
FIG. 2C is a top plan view of the bonded structure of FIG. 2B.

One way to physically protect chips from such unauthorized access is to provide materials that are difficult to remove or penetrate by grinding, polishing, chemical etching or by any other technique. However, some such materials (e.g., abrasive materials) may have a process temperature that is too high to apply to a fabricated semiconductor device, which has strict thermal budgets after devices are fabricated. The processing of some materials can also be chemically incompatible with typical semiconductor processing foundries. The obstructive materials may not be typically used or found in standard semiconductor processing foundries, and/or the obstructive materials may utilize non-standard processing Various embodiments disclosed herein can utilize a chip or chiplet having a protective element 3 (also referred to herein as an obstructive element) including, for example, a security or obstructive material 4 that protects a sensitive circuit region (also referred to herein as sensitive circuitry) to which it is bonded. FIG. 1 is a schematic side sectional view of a bonded structure 1 that includes a protective element 3 bonded (e.g., directly bonded) to a semiconductor element 2, and possible chemical attack pathways P for debonding or damaging sensitive circuitry. FIG. 2A is a schematic side sectional view of the protective element 3. FIG. 2B is a schematic side sectional view of the bonded structure 1 of FIG. 1 without illustrating the chemical attach pathway. FIG. 2C is a top plan view of the bonded structure 1 of FIG. 2B.

In some embodiments, the obstructive material 4 can include a physically destructive material (e.g., an abrasive and/or hard material) configured to physically damage or destroy tooling that attempts to access sensitive circuitry 6, to physically damage or destroy the sensitive circuitry itself 6, or otherwise prevent physical or mechanical access to the sensitive circuitry 6. In some embodiments, the obstructive material 4 can comprise a light-blocking material configured to block incident electromagnetic radiation (e.g., infrared radiation, such as near infrared light) from accessing the sensitive circuitry 6. In some embodiments, the obstructive material 4 can comprise a light-blocking material that is also a destructive material, such that the obstructive material can prevent physical and electromagnetic access to the sensitive circuitry 6. In some embodiments, the obstructive material 4 can comprise a light-blocking material that is not also a destructive material. In other embodiments, the obstructive material 4 can comprise a destructive material that is not also a light-blocking material. In some embodiments, the obstructive material 4 can comprise a light-scattering, light diffusing or light filtering material.

In embodiments that utilize a destructive material for the obstructive material 4, the obstructive material 4 (which can comprise, e.g., a diamond based material like synthetic diamond, diamond-like carbon or industrial diamond, tungsten, a synthetic fiber, carbides (e.g., silicon carbide, tungsten carbide, boron carbide), borides (e.g., tungsten boride, rhenium boride, aluminum magnesium boride, etc.), boron nitride, carbon nitride, sapphire, and some types of ceramics or other suitably destructive material or combination of materials) can be provided adjacent to a bond interface 8. In some embodiments, particles of these destructive materials may be dispensed into a mixture to form the obstructive material 4. In various embodiments, the obstructive material 4 can be unpatterned and/or a blanket material layer, as opposed to a patterned layer. For example, the obstructive layer 4 can comprise a blanket layer over the entire protective element 3, or a blanket layer over the sensitive region 6 of the circuitry to be protected. A bonding layer 5 (e.g., a semiconductor material or inorganic dielectric) can be provided over the blanket layer of obstructive material 4. As explained herein, the obstructive material 4 can be directly bonded without an adhesive to the semiconductor element 2 to form a bonded structure 1 in various arrangements. As explained herein, the semiconductor element 2 can comprise any suitable type of semiconductor element, such as an integrated device die, an interposer, a semiconductor wafer, a reconstituted wafer, etc. The chosen obstructive material 4 may have a high shear modulus, a high bulk modulus and may not exhibit plastic deformation. For example, materials with a hardness of at least 80 GPa (for example, as measured on the Vickers scale) can be used for the destructive material. In various embodiments, the destructive material can have a hardness of at least 12 GPa, at least 13 GPa, at least 15 GPa, at least 20 GPa, at least 30 GPa, or at least 50 GPa, as measured on the Vickers scale. For example, the destructive material can have a hardness in a range of 12.5 GPa to 150 GPa, in a range of 13 GPa to 150 GPa, in a range of 15 GPa to 150 GPa, in a range of 20 GPa to 150 GPa, in a range of 40 GPa to 150 GPa, or in a range of 80 GPa to 150 GPa as measured on the Vickers scale. In another example, the abrasive or destructive material may have a hardness higher than typical materials used in semiconductor chip. For example, hardness of the destructive material may be higher than that of Si, SiO, SiN, SiON, SiCN, etc. The obstructive material 4 may comprise one or more materials or layers deposited over one another in some embodiments. Moreover, the obstructive material 4 may comprise one continuous, non-continuous or patterned layer, or the obstructive material 4 may comprise several such continuous, non-continuous or patterned layers. In some embodiments, there may not be any circuitry or wiring within the obstructive material 4. In other embodiments, the obstructive material 4 may include electrical circuitry embedded in the material 4, or conductive vias partially or fully penetrating the obstructive material 4.

The obstructive or protective element 3 (e.g., a chip or chiplet) can be directly bonded (e.g., using dielectric-to-dielectric bonding techniques, such as the ZiBond® techniques used by Xperi Corporation of San Jose, Calif.) to at least sensitive areas 6 (for example, areas that include security-sensitive components) of an element 2 (such as a semiconductor chip) that can benefit from high security protection from third party tampering. For example, the dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes. After the protective element 3 is direct bonded or hybrid bonded to the element 2 (e.g., a semiconductor chip or integrated device die), the one or more layers of the obstructive material 4 (which may comprise a destructive or abrasive material, a light-blocking material, a light scattering, a light filtering material, or a light diffusing material, etc.) may be positioned proximate the bond interface 8, for example, as close as possible to the bond interface 8. In one embodiment, the obstructive material 4 may be positioned less than 50 microns from the bond interface 8, less than 25 microns from the bond interface, or less than 10 microns from the bond interface 8, for example less than 5 microns from the bond interface 8. In various embodiments, the obstructive material 4 may be positioned in a range of about 1 micron to about 10 microns, or in a range of about 1 micron to about 5 microns, from the bond interface 8. In other embodiments, two or more obstructive or protective element 3 are directly bonded to the element 2.

In various embodiments, the direct bonds can be formed without an intervening adhesive. For example, the protective element 3 and the semiconductor element 2 can each have a bonding layer (such as bonding layer 5) with associated dielectric bonding surfaces 9, 10. The respective dielectric bonding surfaces 9, 10 of the protective element 3 and the semiconductor element 2 can be polished to a high degree of smoothness. The bonding surfaces 9, 10 can be cleaned and exposed to a plasma and/or suitable chemistries (e.g., etchants) to activate the surfaces. In some embodiments, the surfaces 9, 10 can be terminated with a species after activation or during activation (e.g., during the plasma and/or chemical processes). In various embodiments, the terminating species can comprise nitrogen. Further, in some embodiments, the bonding surfaces 9, 10 can be exposed to fluorine. For example, there may be one or multiple fluorine peaks near layer and/or bonding interfaces 8. Thus, in the directly bonded structures 1 disclosed herein, the bonding interface 8 between two dielectric materials can comprise a very smooth interface with higher nitrogen content and/or fluorine peaks at the bonding interface 8.

In various embodiments, direct bonding of separately fabricated protective elements 3 facilitates using separate processing that cannot be directly applied to a fabricated integrated circuit or otherwise sensitive microelectronic element, due to thermal budget, chemical compatibility constraints or other technical reasons. For example, the obstructive materials 4 can be formed on a separate protective element 3 at a higher temperature than the direct bonding temperatures. The direct bonding process itself consumes relatively little thermal budget, including both room temperature initial covalent bonding between dielectric bonding layers, and possible annealing to strengthen the bonds and/or facilitate metal bonding in a hybrid bonding process.

In some embodiments, if a third party attempts to remove the destructive material (e.g., an abrasive and/or hard material), the removal tools can be damaged (by abrasive obstructive materials) and/or the underlying active circuitry is damaged by the removal attempt. The obstructive material 4 can thus be "destructive" to either the removal tools or the protected circuit. Either result can introduce significant resistance to or entirely prevent reverse engineering, hacking, inspection, or other breach of the secured area, circuitry or devices.

In some embodiments, the obstructive material 4 can comprise an abrasive and/or destructive layer on a chiplet. Additionally or alternatively, the chiplet itself may comprise an abrasive and/or destructive material, and/or a hard material. Multiple abrasive and/or destructive materials may be combined in multiple layers or patterns within a layer to enhance the destructive effect. As explained above, the destructive material (e.g., abrasive and/or hard material) may be very close to the bond interface 8. For example, the destructive material may be positioned within 5 microns from the bond interface 8. The third party may attempt to etch or grind away the protective chiplet. If the destructive material is very close to the bond interface 8 between the protective element (chiplet) and the semiconductor element, 2 the method to remove or grind away the chiplet becomes significantly difficult.

In various embodiments, as explained above, the obstructive material 4 can alternatively or additionally comprise a light-blocking material configured to block light and/or an electromagnetic absorbing or dissipating material to block electromagnetic waves. For example, the obstructive material 4 can be selected to block light at wavelengths in a range of 700 nm to 1 mm, in a range of 750 nm to 2500 nm, or in a range of 800 nm to 2500 nm. The obstructive material 4 can alternatively or additionally be selected or shaped to scatter incident light. The obstructive material 4 can alternatively or additionally be electrically conductive, and may effectively act as electromagnetic shield. The obstructive material 4 can additionally or alternatively absorb the electromagnetic waves. In various embodiments, the obstructive material 4 can be selected to block near infrared (NIR) and focused ion beam (FIB) fault intrusion attempts. In another embodiment, the obstructive material 4 may comprise or may be deposited with one or more layers of optical or infrared filters. The thin film optical filters may act to filter out or modify the optical or IR light irradiated through them in either direction, e.g., light incident upon the circuit to trigger a response or the light emitted from the circuit to detect a response to a hacking technique.

In some embodiments, a portion of the security structure or circuit being protected may be shared between the protective element 3 (e.g., the chiplet with the abrasive and/or destructive material) and the element 2 to be protected (e.g., the integrated device die with secure active areas). For example, a hybrid bonding technique can be used to provide conductor-to-conductor direct bonds along a bond interface 8 that includes covalently direct bonded dielectric-to-dielectric surfaces 9, 10. In various embodiments, the conductor-to-conductor (e.g., contact pad to contact pad) direct bonds and the dielectric-to-dielectric bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces 9, 10 can be prepared and directly bonded to one another without an intervening adhesive. Conductive contact pads (which may be surrounded by nonconductive dielectric field regions) may also directly bond to one another without an intervening adhesive. For example, in some embodiments, the respective contact pads can flush with the surface of the dielectric surfaces 9, 10 or be recessed below the dielectric field regions, for example, recessed in a range of 1 nm to 20 nm, or in a range of 4 nm to 10 nm. The bonding surfaces 9, 10 of the dielectric field regions can be directly bonded to one another without an adhesive at room temperature in some embodiments and, subsequently, the bonded structure 1 can be annealed. Upon annealing, the contact pads can expand and contact one another to form a metal-to-metal direct bond.

Additional details of protective elements 3 with obstructive materials 4 may be found throughout U.S. Provisional Patent Application Nos. 62/833,491 ("'491 Application") and 62/953,058 ("'058 Application"), which are incorporated by reference herein in their entirety and for all purposes. The embodiments disclosed herein can be used in combination with any of the embodiments disclosed in the '491 Application and the '058 Application.

As shown in FIGS. 1 and 2A-2C, the bonded structure 1 can include a protective element 3 directly bonded to a semiconductor element 2 over sensitive active circuitry 6 along the bond interface 8 without an adhesive. In FIGS. 1 and 2C, the semiconductor element 2 can be electrically connected to a carrier 32 (such as a package substrate) by way of one or a plurality of bonding wires 34. In other embodiments, the semiconductor element 2 can be mounted to the carrier 32 in a flip chip arrangement by way of solder balls. In the illustrated embodiment, the carrier 32 comprises a package substrate, such as a printed circuit board, a leadframe substrate, a ceramic substrate, etc. In other embodiments, the carrier 32 can comprise an integrated device die, an interposer, a reconstituted wafer, or any other suitable device.

In FIG. 2A, the protective element 3 includes a semiconductor (e.g., silicon) base or substrate 7 (also referred to herein as a handle). In other embodiments, the substrate 7 for the security chiplet need not be semiconductor, as it serves primarily as a handle for an obstructive material 4 and bonding layer 5, as explained herein, and can instead be other materials, such as glass or quartz. However, semiconductor substrates are provided in formats convenient for processing and handling with existing equipment and also with sufficient flatness and smoothness to simplify subsequent polishing of the bonding layer 5.

The protective element 3 can comprise an obstructive material 4 (as a substrate or one or more layers on a substrate) on the substrate 7 comprising a destructive material (e.g., an abrasive and/or hard material), a light- or electromagnetic wave-blocking material, a conductive material, a light filtering or scattering material, etc., and can have more than one of the properties described herein. As explained herein, the protective element 3 can prevent external access to security-sensitive active circuitry 6. As explained above, the obstructive material 4 can comprise an abrasive and/or destructive material (e.g., a material having a high mechanical hardness compared to the materials commonly used in semiconductor fabrication, such as silicon, silicon oxide, silicon nitride, aluminum and copper).

In various embodiments, the obstructive material 4 can additionally or alternatively be selected so as to block impinging electromagnetic radiation. The obstructive material 4 can comprise, for example, ceramic materials, composite materials, diamond, tungsten, a combination of diamond and tungsten, or any other suitable type of obstructive material that can prevent external access to active circuitry on the semiconductor element 2 to which the protective element 3 is to be bonded. In various embodiments, the obstructive material 4 can comprise a material for which selective etchants may be unavailable to remove the obstructive material 4 without removing inorganic dielectrics common to semiconductor fabrication.

The obstructive material 4 can be fabricated and assembled onto the handle or substrate 7 in a first facility at one or more first processing temperatures. For example, the obstructive material 4 may be deposited onto the handle or substrate 7 at temperature(s) of at least 400° C., or at least 800° C., for example, in a range of 400° C. to 1000° C. Such high processing temperatures may not be suitable in foundries that are used to manufacture the semiconductor element 2, e.g., a wafer or an integrated device die (which after fabrication should not be exposed to temperatures of greater than 300° C., or greater than 400° C. for prolonged periods of time), because such high temperatures may damage the active circuitry 6 and other components of the semiconductor element 2. In some cases the materials employed for obstruction layers may be incompatible with semiconductor fabrication facilities due to concerns with contamination.

As shown in FIG. 2A, bonding layer 5 can be provided on the obstructive material 4. The bonding layer 5 can include any suitable type of nonconductive or dielectric material, particularly inorganic dielectrics compatible with integrated circuit fabrication, such as silicon oxide, silicon nitride, etc. In some embodiments, a bonding layer 11 can also be provided on the semiconductor element 2. The bonding layer 5 (e.g., silicon oxide) can be thin such that the layer 5 does not adequately protect or shield the secure circuitry 6 from third party access itself. As shown in FIG. 2B, the protective element 3 can be directly bonded to the semiconductor element 2 without an adhesive along the bond interface 8. As explained herein, the respective bonding layers 5, 11 can be prepared for bonding. For example, the bonding layers 5, 11 can have bonding surfaces 9, 10 that are planarized to a high degree of surface smoothness and exposed to a terminating treatment (e.g., a nitrogen termination treatment). The bonding layers 5, 11 of the protective element 3 and the semiconductor element 2 can be brought into contact with one another at room temperature, and without application of an adhesive or voltage. The bonding layers 5, 11 can form a strong covalent bond along a bond interface 8. The strong covalent bonds may be sufficient for handling and even for post-bonding processing, such as grinding, polishing or otherwise thinning substrates, singulation, etc., but a post-bonding anneal can increase the strength of the bonds even further.

Although the protective element 3 can block external access to the sensitive circuitry 6, third parties may nevertheless attempt to access the security-sensitive active circuitry 6 by removing the protective element 3 from the semiconductor element 2 in order to expose the sensitive circuitry 6. For example, as shown in FIG. 1, a third party may attempt to debond the protective element 3 from the semiconductor element by supplying an etchant along chemical attack pathway P. Various embodiments described herein relate to devices and methods configured to prevent or discourage third parties from removing or otherwise disrupting the functionality of the protective element 3 and underlying sensitive circuitry. Discouragement can take the form of structuring the combination to destroy functionality of the sensitive circuitry 6 upon removal of the protective element 3, to thereby prevent meaningful access to the sensitive circuitry 6 by third parties.

Figure 3:
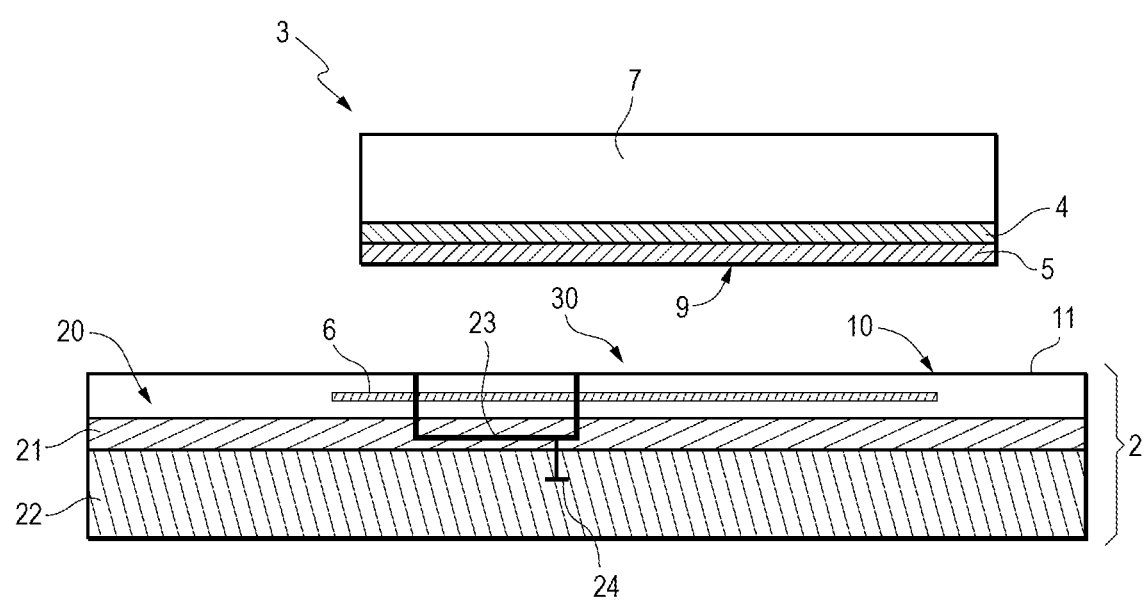
FIG. 3 is a schematic side view of a protective element and a semiconductor element before bonding, according to various embodiments.

FIG. 3 is a schematic side view of a protective element 3 and a semiconductor element 2 before bonding, according to various embodiments. The semiconductor element 2 can include a bulk substrate region 22, one or a plurality of intermediate layers 21, and one or more upper layers that define or include sensitive circuitry 6 including, for example, a power mesh region 20. The sensitive circuitry 6 (e.g., power mesh region 20) can be defined at or near the upper bonding layer 11 of the semiconductor element 2. In various embodiments disclosed herein, the bonded structure 1 can be designed to match the dielectric materials of the dielectric bonding layer 5 of the protective element 3 with the upper layers of the semiconductor element 2 (e.g., an integrated device die, such as a logic die), including the upper bonding layer 11 of the semiconductor element 2 and layers below the bonding layer 11 that include portions of the sensitive circuitry 6. Matching the dielectric bonding layers 5, 11 can compromise matching the upper layers (e.g., upper logic layers, or power mesh region 20) of the semiconductor element 2 (e.g., an integrated device die), such that chemical etch attacks against the direct bonding interface 8 also attack and destroy the power mesh region 20 and/or logic circuitry in the sensitive regions 6 of the semiconductor element 2. For example, the semiconductor element 2 can have only silicon oxide-based materials surrounding metal in the upper metallization layers. Barrier and/or etch stop materials (e.g., SiN, SiC, SiOC, SiON, etc.) can be absent or can be replaced with other materials susceptible to etchants that might otherwise selectively remove oxide (such as differently doped silicon oxides) or other materials that are used for the bonding layers 5, 11. Although various embodiments describe the bonding layers 5, 11 as including silicon oxide or silicon oxide-based material(s) for the bonding surface(s) 9, 10, any other suitable material (e.g., SiN) may also be used for the bonding layers 5, 11.

In various embodiments, the power mesh region 20 can be at least partially provided on the adjacent protective element 3 so that the power mesh region 20 (and/or other sensitive circuitry 6) may be rendered non-functional if the protective element 3 is removed. As shown in FIG. 3, in some embodiments, the bonding layer 5 of the protective element 3 and the upper layer(s) of the semiconductor element 2 (e.g., power mesh region 20) can comprise the same material, e.g., silicon oxide in some embodiments. As noted above, these layers 5, 11 can include signatures of preparation for direct bonding, such as notable spikes in fluorine concentration at oxide interfaces, and/or nitrogen spikes at the bonding interface 8. In such an arrangement, if a third party were to try to remove the protective element 3 from the semiconductor element 2 by selectively etching the material of the bonding layers 5, 11, the etchant would also damage the upper metallization layer(s) (e.g., power mesh layer(s) or region(s) 20) of the semiconductor element 2 so as to damage the sensitive region 6 and prevent external access thereto. Accordingly, providing sensitive circuitry 6 (such as the power mesh region 20) at or near the upper bonding layer 11 of the semiconductor element 2 can serve as a disruption structure 30 that is configured to disrupt functionality of the circuitry 6 upon debonding of the protective element 3 from the semiconductor element 2. As explained herein, matching the materials of the dielectric bonding layers 5, 11 can provide an etch pathway that can disrupt functionality of the circuitry 6 upon debonding or other disruption. The disruption structures 30 described herein can disrupt sensitive active circuitry 6, which includes one or more of active devices (e.g., transistors and other active circuits), as well as local interconnects and wiring (e.g., back end wiring) connected to the active devices.

In some embodiments, a conductive signal trace 23 can be provided through the sensitive circuit regions 6 (e.g., the power mesh region 20). The conductive trace 23 can be configured to detect whether the protective element 3 has been debonded from the semiconductor element 2. For example, the conductive trace 23 can be connected to other circuitry (e.g., a monitoring circuit 24) that can monitor an impedance to determine if the direct bond has been compromised. If the protective element 3 is removed from the semiconductor element 2, the removal can trigger a signal along the trace 23 (e.g., detected by a change in impedance, current, voltage, etc.) indicative of the removal. The monitoring circuit 24 can be formed in the protective element 3 or the semiconductor element 2, or can span both the protective element 3 and the semiconductor element 2. In the illustrated embodiment, the monitoring circuit 24 can be provided in the bulk substrate region 22.

FIG. 4 is a schematic side view of a protective element 3 and a semiconductor element 2 before bonding, according to another embodiment. Unless otherwise noted, the components in FIG. 4 may be the same as or generally similar to like-numbered components of FIGS. 1-3. In FIG. 4, the semiconductor element 2 can comprise one or multiple intermediate layers 21 below the upper bonding layer(s) 11, e.g. one or more interlayer dielectric (ILD) materials. The intermediate layer(s) 21 can include one or more barrier layers 26 between dielectric routing or circuit layers 27. The barrier layers 26 can, for example, serve as an etch stop, CMP stop and/or barrier layers for the semiconductor element 2 to be protected. The layers of alternating dielectric barriers 26 (e.g., barrier layer(s)) and routing layer 27 can comprise silicon nitride in some arrangements. Other examples for the barrier layers 26 include SiC, SiON, SiOC, etc. These barrier layer(s) may effectively act as blocking layers selected for the etchants used by the third party to remove the protective element 3. As shown in FIG. 4, one or more openings 25 can be provided in the intermediate layer(s) 21 (e.g., through the barrier layers 26) to create an etch pathway 28 through the upper layer(s) 11 and through at least a portion of the intermediate layer(s) 21. The openings 25 in the blocking layer(s) 26 can serve to damage sensitive circuitry 6 of the semiconductor element 2 if a third party attempts to remove the protective element 3 by etching. The sensitive circuitry 6 can be provided in one or more of the intermediate layers 21 and/or semiconductor region 22.

Thus, in various embodiments, a disruption structure 30 can be provided to disrupt functionality of at least a portion of the sensitive active circuitry 6 (including active devices and/or interconnects or wiring structures connected to the active devices) upon debonding of the protective element 3 from the semiconductor element 2. In various arrangements, the disruption structure 30 can include an etch pathway 28 through a portion of the semiconductor element 2. Beneficially, the etch pathway 28 can enable chemical etchant to destroy or damage circuitry 6 in the semiconductor element 2 if a third party attempts to debond the protective element 3 by etching. In some arrangements, one or more blocking layers 26 (e.g., silicon nitride) can be present in the semiconductor element 2. These blocking layers 26 are typically present in an integrated circuit metallization stack and can function, for example, as etch stops or CMP stops during processing of the metallization or back-end-of-line (BEOL) structures, and/or as diffusion barriers against migration of metal into the surrounding interlayer dielectrics (ILDs, typically a form of silicon oxide). The blocking layers 26 may also incidentally protect underlying interconnect patterns (e.g., power mesh regions 20) and underlying circuitry 6 during a selective etch of the bonding layers 5, 11 that bond the protective element 3 to the sensitive circuitry 6. Accordingly, openings 25 can be selectively provided in the blocking layers 26 to create the etch pathway 28 in lower or intermediate layers 21 of the semiconductor element 2 in the event of a chemical attack on the bonding layers 5, 11 (e.g., silicon oxide). Such an etch pathway 28 can destroy or disable underlying circuitry 6 of the semiconductor element 2, such as the power mesh region 20 of the semiconductor element 2. In such embodiments, the semiconductor element 2 can be modified in conjunction with the addition of the protective element 3. The openings 25 in the blocking layers 26 can have a width in a range of 2 micron to 3 mm. For example, in various embodiments, the openings 25 can have a width in a range of 1 micron to 100 microns, 100 microns to 1 mm, or 1 mm to 3 mm.

In various embodiments, a trench (not shown in FIG. 4) can be provided along an edge of the semiconductor element 2 (e.g., a die) to cause any etchant used for debonding the protective element 3 to attack lower layers of the semiconductor element 2. Although a trench can be used in some arrangements, other patterns that create cavities or voids may be suitable.

In some embodiments, as explained above, a trace 23 can be provided in the power mesh region 20 of the semiconductor element 2. The trace 23 can be used to monitor the impedance or other electrical property of the circuitry 6 by way of a monitoring circuit 24. Removal of the dielectric bonding layer 11 of the semiconductor element can cause an increase in the impedance considerably, indicating that a third party may be tampering with the bonded structure 1. For example, the trace 23 can comprise a diving board trace in the power mesh region 20 that sags if the dielectric bonding layer 11 of the semiconductor element 2 is removed or separated from the protective element 3.

In various embodiments, the monitoring circuit 24 can be provided on one or both of the protective element 3 and the semiconductor element 2. For example, in some embodiments, the monitoring circuit 24 can be provided on the semiconductor element 2. The bonded structure 1 can also include a mesh with a large number of conductive interconnects to that the mesh would be severed if the protective element 3 were removed. Reconnecting such a large number of interconnects to the mesh with a post-debonding attach would be impractical. The monitoring circuit 24 can be configured to electrically disable the sensitive circuitry 6 if any indication of tampering is detected.

Figure 5A:
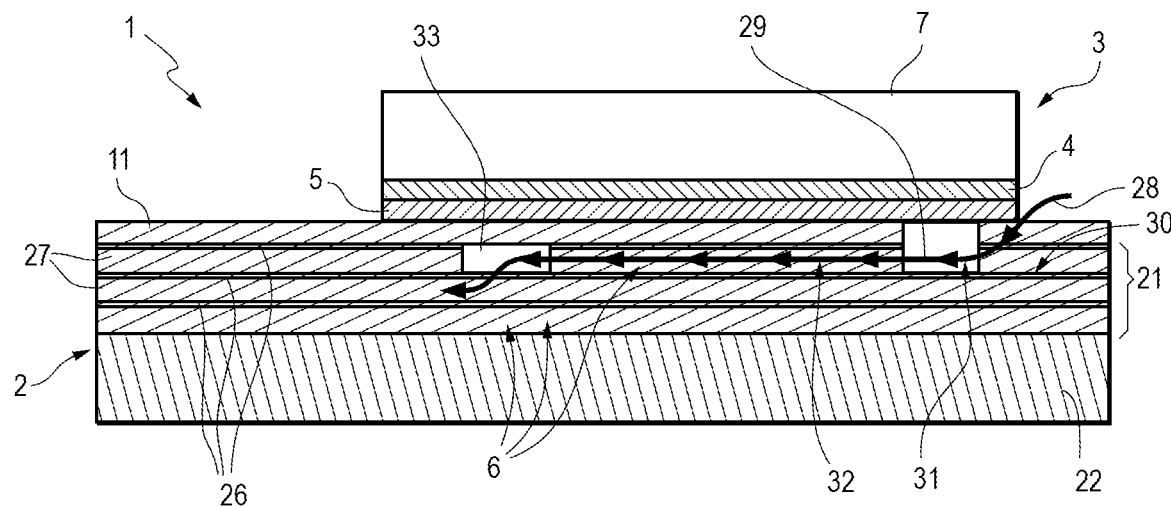
FIGS. 5A-5B illustrate schematic side sectional views of bonded structures, according to various embodiments.
Figure 5B:
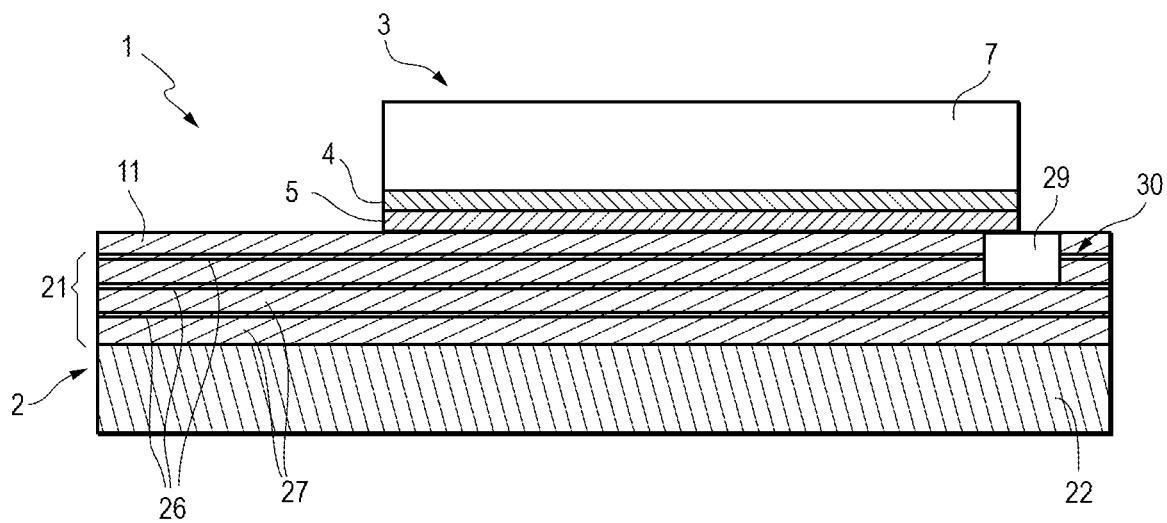

FIGS. 5A-5B illustrate schematic side sectional views of bonded structures 1, according to various embodiments. Unless otherwise noted, components of FIGS. 5A-5B may be the same as or generally similar to like-numbered components of FIGS. 1-4. In FIGS. 5A-5B, one or more cavities 29 can be provided in the upper dielectric layer(s) of the semiconductor element 2. For example, as shown in FIGS. 5A-5B, the cavities 29 can be formed in the bonding layer 11 and one or more of the intermediate layers 21 of the semiconductor element 2. Like the openings 25 of FIG. 4, the one or more cavities 29 of FIGS. 5A-5B can similarly provide a disruption structure 30 that includes an etch pathway 28 to enable the etchant to penetrate intermediate and lower layer(s) of the semiconductor element 2 to disrupt the functionality of the security-sensitive circuitry 6 (including active devices and/or interconnects or wiring structures connected to the active devices) upon debonding of the protective element 3 from the semiconductor element 2. For example, in FIG. 5A, a cavity 29 on the right side of the structure 1 can provide a vertical pathway 31 through the bonding layer 11 of the semiconductor element 2 to the intermediate layers 21. Lateral channels 32 can connect this vertical pathway 31 to other cavities 33 of the intermediate layers 21, providing a networks of voids or cavities 29 to provide ready access for any debonding etchants across the semiconductor element 2 and through intermediate layers 21. Known processes can create the cavities 29 and possible microchannels interconnecting them. The cavities 29 can have length, width and height dimensions in a range of 1 micron to 3 mm. For example, in various embodiments, the cavities 29 can have length, width and height dimensions in a range of 1 micron to 100 microns, in a range of 100 microns to 1 mm, or in a range of 1 mm to 3 mm.

Figure 6A:
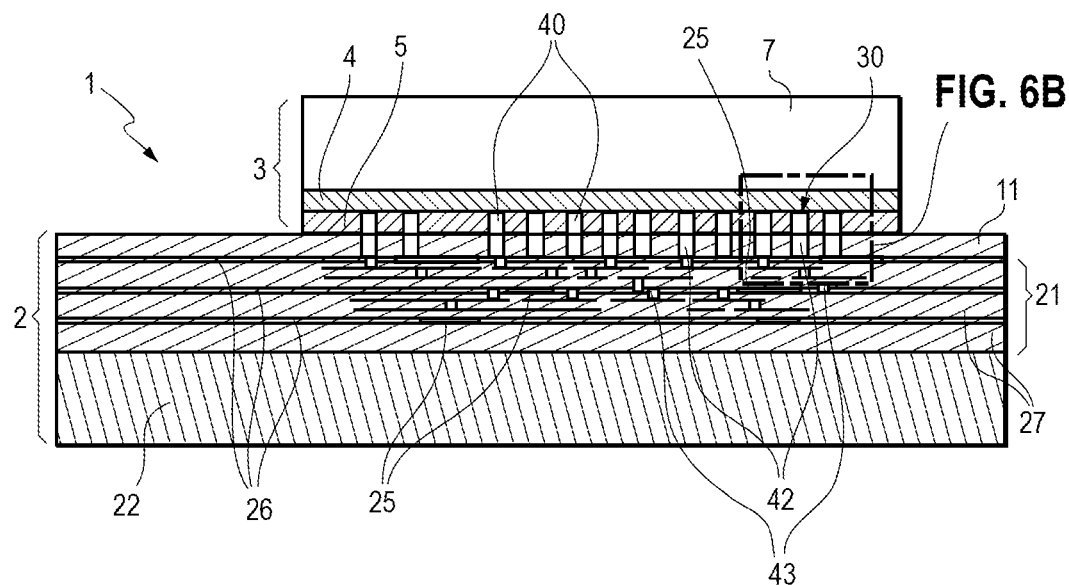
FIG. 6A is a schematic side sectional view of a bonded structure, according to another embodiment.
Figure 6B:
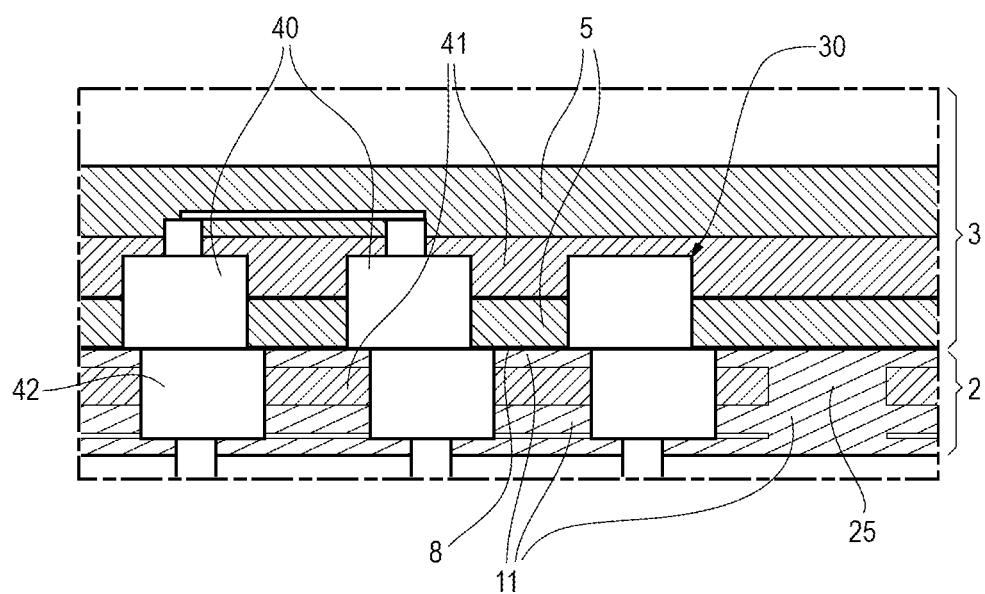
FIG. 6B is a magnified view of a portion of the bonded structure shown in FIG. 6A.

FIG. 6A is a schematic side sectional view of a bonded structure 1, according to another embodiment. FIG. 6B is a magnified view of a portion of the bonded structure 1 shown in FIG. 6A. Unless otherwise noted, components in FIGS. 6A-6B may be the same as or generally similar to like-numbered components of FIGS. 1-5B. In various embodiments, the dielectric bonding layer 5 and conductive contact pads 40 of the protective element 3 can be directly bonded to a corresponding dielectric bonding layer 11 and corresponding conductive contacts 42 of the semiconductor element 2 without an adhesive. In such arrangements, the directly bonded conductive contacts 40, 42 can be used to monitor connectivity between the protective element 3 and the semiconductor element 2 as an indicator of tampering or debonding attempts. Multiple conductive contact pads 40, 42 can be used but in some arrangements only a subset of contacts may complete the connection, while other contacts create electrical shorts.

In some embodiments that utilize dielectric and conductive direct bonds (e.g., direct bond interconnect, or DBI, connections), if the dielectric bonding layer 5 and/or 11 (e.g., oxide) is removed, and the protective element 3 is pulled away from the semiconductor element 2, the removal will cause a defect (e.g., a short in the power mesh region 20) in the sensitive circuitry 6. For example, etch resistant material may embed portions of the conductors (e.g., contact pads 40) in the protective element 3 such that the conductors remain connected to the protective element 3 even after selective etching of the bonding layers 5 and/or 11. Non-limiting examples of the etch resistant material include silicon nitride, which can resist selective etching of silicon oxide bonding layers. Various embodiments may not utilize a chain connection on a dummy die.

As shown in FIGS. 6A and 6B, in some embodiments, a dielectric bonding layer 5 and conductive contact pads 40 of the protective element 3 can be directly bonded to a corresponding dielectric bonding layer 11 and corresponding conductive contact pads 42 of the semiconductor element 2 without an adhesive, in a hybrid direct bonding process, such as the Direct Bond Interconnect or DBI® process available commercially from Xperi Corporation of San Jose, Calif. As explained above, the dielectric bonding layer(s) 5 and/or 11 may be selectively etched by a third party with an etchant, which may remove the protective element 3 from the semiconductor element 2. However, removal of the protective element 3 can destroy the underlying sensitive circuitry 6 by ripping up the conductive vias and traces from the semiconductor element 2.

As shown in FIGS. 6A-6B, in some embodiments, blocking layers 41 (e.g., silicon nitride) can be used in the protective element 3 and the semiconductor element 2 as a barrier to prevent freeing the metal in the protective element 3 during debonding attempts. The blocking layer 41 can be thicker than conventional etch stop layers (e.g., in a range of 250 nm to 400 nm) and can serve as an anchor material layer to anchor the bonded contact pads 40, 42 to underlying sensitive circuitry 6 (by way of other internal traces and connections 43). In some embodiments, a continuous blocking or anchor layer 41 (which can comprise one or a plurality of layers) can be provided on the protective element 3 to complicate debonding efforts. In other embodiments, the blocking materials 41 can be provided as a multi-layer dielectric ring to complicate debonding and die separation. Even if the bonding layers 5, 11 are selectively removed, the contact pads 40, 42 (e.g., metals) of the protective element 3 and the semiconductor element 2 to be protected remain connected and intact such that separation of the elements 3, 2 would cause physical damage to the semiconductor element 2. For example, even if the dielectric bonding layers 5, 11 are etched away, the direct bond connection between contact pads 40, 42 and protected by the blocking layer 41 can remain intact, which can cause the circuitry in the underlying layers 21 and region 22 that are connected to the contact pads 40, 42 to be ripped apart and destroyed. For example, the connections 43 can connect the directly bonded pads 40, 42 to wiring and circuitry within the layers 21 and/or extending to the sensitive circuitry itself. Additionally, as with the embodiment disclosed above with respect to FIG. 4, in the lower semiconductor element 2, openings 25 in the anchor layers 41 and/or blocking materials 26 (e.g., a thick blocking layer as shown to protect the metals of the semiconductor elements 2, and or etch stops, CMP stops or barrier layers) may be provided around the sensitive region 6 of the semiconductor element 2. Such openings 25 can form an etch pathway to enable the etchant to reach underlying layers of the semiconductor element 2 and destroy the security-sensitive circuitry 6 and/or wiring that connects to the sensitive circuitry 6.

FIG. 7 illustrates another example of a disruption structure 30. Unless otherwise noted, components in FIG. 7 may be the same as or generally similar to like-numbered components of FIGS. 1-6B. In FIG. 7, the obstructive material 4 of the protective element 3 can be patterned to make delayering and debonding more difficult or uncontrollable. For example, vias or pathways (e.g., openings) 45 through the obstructive material 4 can be provided and filled with a dielectric material 46 (e.g., silicon oxide). The vias 45 can comprise over-etched vias, under-etched vias, through vias, partial or blind vias, etc., as shown in FIG. 7. The vias or pathways 46 through the obstructive material 4 can make debonding more challenging by complicating the debonding etch pathway, making it more difficult to debond without causing disabling damage to the semiconductor element 2 and its sensitive circuitry 6 being protected. For example, openings 46 can cause an etchant or a plasma to etch more quickly through the openings 46 (or partial openings) which may destroy underlying circuits while the etchant or plasma is trying to remove the other obstructive material 4.

Figure 8:
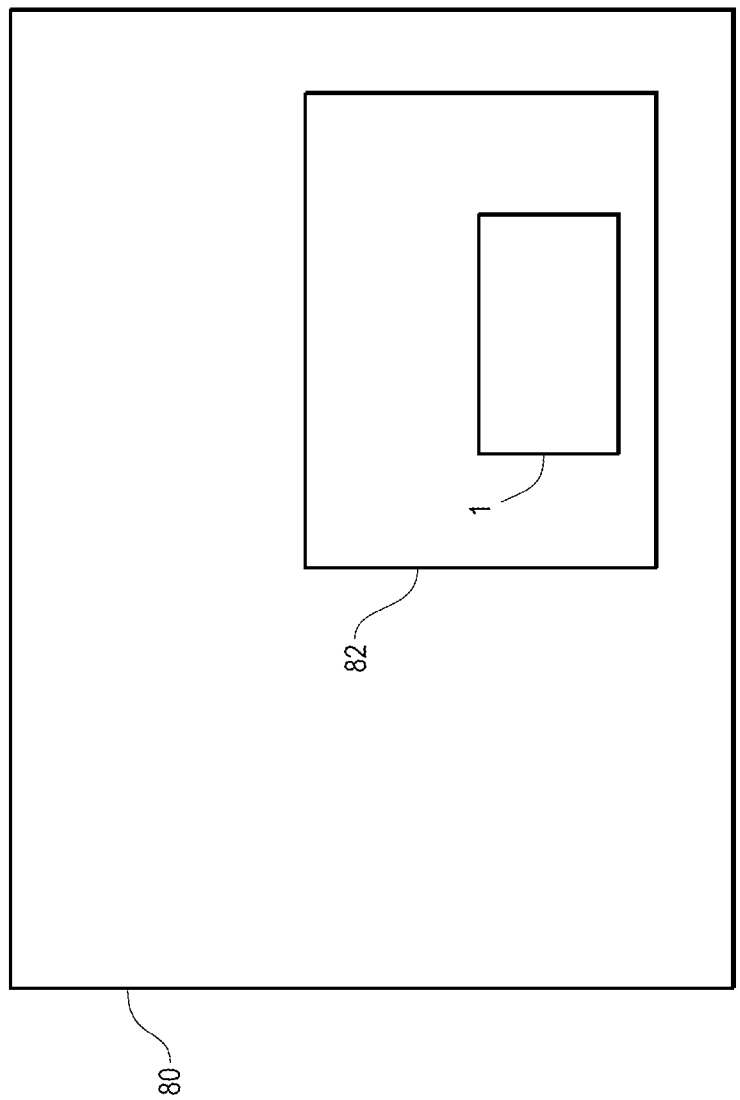
FIG. 8 is a schematic diagram of an electronic system incorporating one or more bonded structures, according to various embodiments.

FIG. 8 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The package 82 may be similar to or the same as the packages 30 described herein. The system 80 shown in FIG. 8 can comprise any of the bonded structures 1 and associated protective elements 3 as shown and described herein.

In one embodiment, a bonded structure is disclosed. The bonded structure can include a semiconductor element comprising active circuitry. The bonded structure can include an obstructive element directly bonded to the semiconductor element without an adhesive along a bonding interface, the obstructive element including an obstructive material disposed over at least a portion of the active circuitry, the obstructive material configured to obstruct external access to the active circuitry. The bonded structure can include a disruption structure configured to disrupt functionality of the at least a portion of the active circuitry upon debonding of the obstructive element from the semiconductor element.

In some embodiments, the obstructive material can be positioned at a distance less than 10 microns from the bonding interface. The obstructive material can be positioned at a distance less than 5 microns from the bonding interface. The obstructive material can comprise a destructive material having a hardness in a range of 20 GPa to 150 GPa. The obstructive material can comprise a destructive material having a hardness of at least 80 GPa. The disruption structure can comprise an etch pathway through a portion of the semiconductor element. The semiconductor element can comprise a first bonding layer and wherein the obstructive element comprises a second bonding layer directly bonded to the first bonding layer without an adhesive. The first bonding layer can comprise a first material, the etch pathway also comprising the first material. The first material can comprise silicon oxide. The first bonding layer can further comprise one or more of fluorine and nitrogen. The disruption structure can be configured to disrupt the functionality of the at least a portion of the active circuitry upon debonding from a selective etch of one or more of the first and second bonding layers. The first and second bonding layers can comprise silicon oxide. The bonded structure can include one or more intermediate layers between the first bonding layer and the active circuitry, the one or more intermediate layers comprising circuitry, the etch pathway extending through at least a portion of the one or more intermediate layers. The one or more intermediate layers can comprise a blocking layer, one or more openings formed in the blocking layer, the blocking extending through the one or more openings. One or more openings in the blocking layer can comprise the material of the first bonding layer. The blocking layer can comprise silicon nitride. The bonded structure can comprise a plurality of dielectric layers separated by a plurality of blocking layers, the plurality of dielectric layers comprising a same material as the first bonding layer. The disruption structure can comprise a cavity in the one or more intermediate layers. The bonded structure can comprise a first plurality of contact pads in the first bonding layer and a second plurality of contact pads in the second bonding layer, the first plurality of contact pads directly bonded to the second plurality of contact pads. The bonded structure can comprise a first blocking layer in the first bonding layer and an anchor material layer in the second bonding layer, the first blocking layer having one or more openings therethrough. The second plurality of contact pads can be at least partially embedded in the anchor material layer. At least one contact pad can be connected to a monitoring circuit to monitor connectivity of the directly bonded first and second pluralities of contact pads. At least two or more of the second plurality of contact pads can be electrically connected. The bonded structure can comprise a back-end-of-line (BEOL) layer comprising power circuitry in the obstructive element. The disruption structure can comprise a conductive trace configured to detect whether the obstructive element has been debonded from the semiconductor element. The obstructive material can be patterned to expose portions of the semiconductor element, the etch pathway extending through the exposed portions. A first hardness of the obstructive material can be greater than a second hardness of the semiconductor element or a third hardness of the material at the bonding interface. The obstructive material can comprise an abrasive material. The obstructive material can comprise a light-blocking material. The light-blocking material can be configured to block light at near infrared (NIR) wavelengths. The obstructive material can comprise an optical or infrared (IR) blocking or modifying material.

In another embodiment, a bonded structure is disclosed. The bonded structure can comprise a semiconductor element comprising active circuitry. The bonded structure can comprise an obstructive element directly bonded to the semiconductor element without an adhesive along a bonding interface, the obstructive element including an obstructive material disposed over at least a portion of the active circuitry, the obstructive material configured to obstruct external access to the active circuitry. The bonded structure can comprise an etch pathway through a portion of the semiconductor element, the etch pathway configured to disrupt functionality of the at least a portion of the active circuitry while debonding of the obstructive element from the semiconductor element.

In some embodiments, the obstructive material can be positioned at a distance less than 10 microns from the bonding interface. The obstructive material can be positioned at a distance less than 5 microns from the bonding interface. The obstructive material can comprise a destructive material having a hardness in a range of 20 GPa to 150 GPa. The obstructive material can comprise a destructive material having a hardness of at least 80 GPa. The semiconductor element can comprise a first bonding layer and the obstructive element can comprise a second bonding layer directly bonded to the first bonding layer without an adhesive. The first bonding layer can comprise a first material, the etch pathway also comprising the first material. The first material can comprise silicon oxide. The first bonding layer can comprise one or more of fluorine and nitrogen. One or more intermediate layers can be between the first bonding layer and the active circuitry, the one or more intermediate layers comprising circuitry, the etch pathway extending through at least a portion of the one or more intermediate layers. The one or more intermediate layers can comprise a blocking layer, one or more openings formed in the blocking layer, the etch pathway extending through the one or more openings. The blocking layer can comprise silicon nitride. One or more openings or partial openings in the blocking layer can comprise the material of the bonding interface. A plurality of dielectric layers can be separated by a plurality of blocking layers, the plurality of dielectric layers comprising a same material as the first bonding layer. A cavity can be in the one or more intermediate layers. A first plurality of contact pads in the first bonding layer and a second plurality of contact pads can be in the second bonding layer, the first plurality of contact pads directly bonded to the second plurality of contact pads. At least two or more of the second plurality of contact pads can be electrically connected. A first blocking layer can be in the first bonding layer and an anchor material layer can be in the second bonding layer, the first blocking layer having one or more openings therethrough. The second plurality of contact pads can be at least partially embedded in the anchor material layer. At least one contact pad can be connected to a monitoring circuit to monitor connectivity of the directly bonded first and second pluralities of contact pads. The obstructive material can be patterned to expose portions of the semiconductor element, the etch pathway extending through the exposed portions.

In another embodiment, a bonded structure is disclosed. The bonded structure can comprise a semiconductor element comprising active circuitry. The bonded structure can comprise an obstructive element directly bonded to the semiconductor element without an adhesive, the obstructive element including an obstructive material disposed over at least a portion of the active circuitry, the obstructive material configured to obstruct external access to the active circuitry. The bonded structure can comprise a conductor to connected to one or both of the semiconductor element and the obstructive element, the conductor configured to detect whether the obstructive element has been debonded from the semiconductor element.

In some embodiments, the semiconductor element can comprise a first bonding layer and the obstructive element can comprise a second bonding layer directly bonded to the first bonding layer without an adhesive. The first and second bonding layers can comprise silicon oxide. One or more intermediate layers can be between the first bonding layer and the active circuitry, the one or more intermediate layers comprising circuitry, the etch pathway extending through at least a portion of the one or more intermediate layers. The one or more intermediate layers can comprise a blocking layer, one or more openings formed in the blocking layer, the etch pathway extending through the one or more openings. The conductor can be at least partially disposed in the one or more intermediate layers. A monitoring circuit can be configured to monitor an electrical current through the conductor to determine whether the obstructive element has been debonded from the semiconductor element. The monitoring circuit can be configured to indicate that the obstructive element has been debonded from the semiconductor element if an electrical signal through the conductor is interrupted. A first plurality of contact pads can be in the first bonding layer and a second plurality of contact pads can be in the second bonding layer, the first plurality of contact pads directly bonded to the second plurality of contact pads without an adhesive. A first blocking layer can be in the first bonding layer and an anchor material layer can be in the second bonding layer, the first blocking layer having one or more openings therethrough. The second plurality of contact pads can be at least partially embedded in the second blocking layer. At least one contact pad can be connected to a monitoring circuit to monitor connectivity of the directly bonded first and second pluralities of contact pads. A first hardness of the obstructive material can be greater than a second hardness of the semiconductor element. The obstructive material can comprise an abrasive material. The obstructive material can comprise a light-blocking material. The light-blocking material can be configured to block light at near infrared (NIR) wavelengths.

In another embodiment, a method of forming a bonded structure is disclosed. The method can comprise patterning a disruption structure into at least one of a semiconductor element having active circuitry and an obstructive element including an obstructive material disposed over at least a portion of the active circuitry, the obstructive material configured to obstruct external access to the active circuitry. The method can comprise directly bonding the obstructive element to the semiconductor element without an adhesive, the debonding disruption structure configured to disrupt functionality of the semiconductor element upon debonding of the obstructive element from the semiconductor element.

In some embodiments, the method can comprise depositing a first bonding layer on the semiconductor element and a second bonding layer on the obstructive element, the method comprising directly bonding the first and second bonding layers without an adhesive. The method can comprise forming a plurality of dielectric layers separated by a plurality of blocking layers, the plurality of dielectric layers comprising a same material as the first bonding layer. The method can comprise directly bonding a first plurality of contact pads in the first bonding layer to a second plurality of contact pads in the second bonding layer. The method can comprise forming a first blocking layer in the first bonding layer and an anchor material layer in the second bonding layer, the first blocking layer having one or more openings therethrough. Patterning the disruption structure can comprise patterning openings through one or more blocking layers within one or more intermediate layers. The method can comprise patterning openings in the obstructive material to expose portions of the semiconductor element. The method can comprise monitoring an electrical signal along a conductor disposed at least partially in one or both of the semiconductor element and the obstructive element to determine whether the obstructive element has been debonded from the semiconductor element.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A bonded structure comprising:
   a semiconductor element comprising active circuitry;
   an obstructive element directly bonded to the semiconductor element without an adhesive, the obstructive element including an obstructive material disposed over at least a portion of the active circuitry, the obstructive material configured to obstruct external access to the active circuitry; and
   a conductor connected to a monitoring circuit usable to determine whether the direct bond between the semiconductor element and the obstructive element has been tampered with.

2. The bonded structure of claim 1, wherein the semiconductor element comprises a first bonding layer and wherein the obstructive element comprises a second bonding layer directly bonded to the first bonding layer without an adhesive.

3. The bonded structure of claim 2, wherein the first and second bonding layers comprise silicon oxide.

4. The bonded structure of claim 2, further comprising one or more intermediate layers between the first bonding layer and the active circuitry, the one or more intermediate layers comprising circuitry, the etch pathway extending through at least a portion of the one or more intermediate layers.

5. The bonded structure of claim 4, wherein the one or more intermediate layers includes a blocking layer, one or more openings formed in the blocking layer, the etch pathway extending through the one or more openings.

6. The bonded structure of claim 4, wherein the conductor is at least partially disposed in the one or more intermediate layers.

7. The bonded structure of claim 1, wherein the monitoring circuit is configured to monitor an electrical current through the conductor.

8. The bonded structure of claim 7, wherein the monitoring circuit is configured to indicate that the direct bond has been tampered with if an electrical signal through the conductor is interrupted.

9. The bonded structure of claim 2, further comprising a first plurality of contact pads in the first bonding layer and a second plurality of contact pads in the second bonding layer, the first plurality of contact pads directly bonded to the second plurality of contact pads without an adhesive.

10. The bonded structure of claim 9, further comprising a first blocking layer in the first bonding layer and an anchor material layer in the second bonding layer, the first blocking layer having one or more openings therethrough.

11. The bonded structure of claim 10, wherein the second plurality of contact pads are at least partially embedded in the second blocking layer.

12. The bonded structure of claim 9, wherein at least one contact pad is connected to a monitoring circuit to monitor connectivity of the directly bonded first and second pluralities of contact pads.

13. The bonded structure of claim 1, wherein a first hardness of the obstructive material is greater than a second hardness of the semiconductor element.

14. The bonded structure of claim 1, wherein the obstructive material comprises an abrasive material.

15. The bonded structure of claim 1, wherein the obstructive material comprises a light-blocking material.

16. The bonded structure of claim 15, wherein the light-blocking material is configured to block light at near infrared (NIR) wavelengths.

* * * * *